United States Patent
Lee et al.

(10) Patent No.: US 12,212,339 B2
(45) Date of Patent: Jan. 28, 2025

(54) ERROR CORRECTION CIRCUIT, MEMORY SYSTEM, AND ERROR CORRECTION METHOD

(71) Applicant: SAMSUNG ELECTRONICS CO., LTD., Suwon-si (KR)

(72) Inventors: Myungkyu Lee, Suwon-si (KR); Kijun Lee, Suwon-si (KR); Sunghye Cho, Suwon-si (KR); Sungrae Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/984,430

(22) Filed: Nov. 10, 2022

(65) Prior Publication Data

US 2023/0146904 A1    May 11, 2023

(30) Foreign Application Priority Data

Nov. 10, 2021  (KR) .................. 10-2021-0154257
May 13, 2022  (KR) .................. 10-2022-0059102

(51) Int. Cl.
H03M 13/15  (2006.01)
H03M 13/00  (2006.01)

(52) U.S. Cl.
CPC ........ *H03M 13/159* (2013.01); *H03M 13/611* (2013.01)

(58) Field of Classification Search
CPC ................................................ H03M 13/159
See application file for complete search history.

(56) References Cited

U.S. PATENT DOCUMENTS 5,027,357 A * 6/1991 Yu .................. H03M 13/091
                                                          714/755
5,600,659 A    2/1997 Chen
5,757,823 A    5/1998 Chen et al.
(Continued)

FOREIGN PATENT DOCUMENTS

TW    202006544 A    2/2020
TW    I707354 B     10/2020

OTHER PUBLICATIONS

Communication dated Jul. 26, 2023 issued by the Taiwan Patent Office in counterpart Taiwan Application No. 111142683.
Klockmann, A. [et al.]: "A new 3-bit burst-error correcting code", IEEE 23rd International Symposium on On-Line Testing and Robust System Design (IOLTS) 2017, Jul. 3, 2017 (6 total pages).
Das, A. [et al.]: "Efficient non-binary Hamming codes for limited magnitude errors in MLC PCMs", Proc. IEEE International Symposium on Defect and Fault Tolerance in VLSI and Nanotechnology Systems (DFT) 2018, Oct. 8, 2018 (Oct. 8, 2018), pp. 1-6, XP033493160, DOI: 10.1109/DFT.2018.8602848 (3 total pages).
(Continued)

*Primary Examiner* — Joseph D Torres
(74) *Attorney, Agent, or Firm* — Sughrue Mion, PLLC

(57) ABSTRACT

An error correction circuit, including an error correction code (ECC) encoder configured to generate parity data corresponding to main data based on a parity generation matrix, and to output a codeword including the main data and the parity data to a plurality of memory devices; and an ECC decoder configured to: read the codeword from the plurality of memory devices, generate a syndrome corresponding to the codeword based on a parity check matrix, detect an error pattern based on the syndrome, generate a plurality of estimation syndromes corresponding to the error pattern using a plurality of partial sub-matrices included in the parity check matrix, and correct an error included in the read codeword based on a result of a comparison between the syndrome and the plurality of estimation syndromes.

20 Claims, 16 Drawing Sheets

(56) References Cited

U.S. PATENT DOCUMENTS

| | | | |
|---|---|---|---|
| 5,878,061 A * | 3/1999 | Hauck | H04L 1/0057 |
| | | | 714/800 |
| 8,739,005 B2 | 5/2014 | Uchikawa | |
| 9,043,674 B2 | 5/2015 | Wu et al. | |
| 9,092,350 B1 * | 7/2015 | Jeon | G11C 29/44 |
| 9,195,551 B2 | 11/2015 | Das et al. | |
| 9,690,653 B2 | 6/2017 | Suzuki | |
| 9,698,830 B2 | 7/2017 | Motwani et al. | |
| 10,572,343 B2 | 2/2020 | Halbert et al. | |
| 10,700,707 B2 | 6/2020 | Kim | |
| 10,761,927 B2 | 9/2020 | Lu | |
| 10,872,011 B2 | 12/2020 | Bains et al. | |
| 10,944,429 B1 * | 3/2021 | Yang | H03M 13/13 |
| 2013/0031440 A1 * | 1/2013 | Sharon | G06F 11/1012 |
| | | | 714/E11.032 |
| 2018/0191376 A1 * | 7/2018 | Wang | H03M 13/1108 |

OTHER PUBLICATIONS

Wolf, J.: "On codes derivable from the tensor product of check matrices", IEEE Transactions on Information Theory, vol. 11, No. 2, Apr. 1, 1965 (Apr. 1, 1965), pp. 281-284, XP093013752, ISSN: 0018-9448, DOI: 10. 1109/TIT.1965.1053771 (7 total pages).

Wolf, J.: "An introduction to tensor product codes and applications to digital storage systems", Proc. IEEE Information Theory Workshop, Oct. 1, 2006 (Oct. 1, 2006), pp. 6-10, XP031055481, ISBN: 978-1-4244-0067-6 (5 total pages).

Communication dated Jan. 30, 2023, issued by the European Patent Office, Application No. 22206488.3.

* cited by examiner

FIG. 7

ZSM $$\begin{matrix} 0&0&0&0&0&0&0&0&0&0&0&0&0&0&0&0 \\ 0&0&0&0&0&0&0&0&0&0&0&0&0&0&0&0 \\ 0&0&0&0&0&0&0&0&0&0&0&0&0&0&0&0 \\ 0&0&0&0&0&0&0&0&0&0&0&0&0&0&0&0 \\ 0&0&0&0&0&0&0&0&0&0&0&0&0&0&0&0 \\ 0&0&0&0&0&0&0&0&0&0&0&0&0&0&0&0 \\ 0&0&0&0&0&0&0&0&0&0&0&0&0&0&0&0 \\ 0&0&0&0&0&0&0&0&0&0&0&0&0&0&0&0 \\ 0&0&0&0&0&0&0&0&0&0&0&0&0&0&0&0 \\ 0&0&0&0&0&0&0&0&0&0&0&0&0&0&0&0 \\ 0&0&0&0&0&0&0&0&0&0&0&0&0&0&0&0 \\ 0&0&0&0&0&0&0&0&0&0&0&0&0&0&0&0 \\ 0&0&0&0&0&0&0&0&0&0&0&0&0&0&0&0 \\ 0&0&0&0&0&0&0&0&0&0&0&0&0&0&0&0 \\ 0&0&0&0&0&0&0&0&0&0&0&0&0&0&0&0 \\ 0&0&0&0&0&0&0&0&0&0&0&0&0&0&0&0 \end{matrix}$$

$p$ (rows), $p$ (columns)

FIG. 8

ISM $$\left.\begin{array}{c}p\left\{\begin{array}{c}1\ 0\ 0\ 0\ 0\ 0\ 0\ 0\ 0\ 0\ 0\ 0\ 0\ 0\ 0\ 0 \\ 0\ 1\ 0\ 0\ 0\ 0\ 0\ 0\ 0\ 0\ 0\ 0\ 0\ 0\ 0\ 0 \\ 0\ 0\ 1\ 0\ 0\ 0\ 0\ 0\ 0\ 0\ 0\ 0\ 0\ 0\ 0\ 0 \\ 0\ 0\ 0\ 1\ 0\ 0\ 0\ 0\ 0\ 0\ 0\ 0\ 0\ 0\ 0\ 0 \\ 0\ 0\ 0\ 0\ 1\ 0\ 0\ 0\ 0\ 0\ 0\ 0\ 0\ 0\ 0\ 0 \\ 0\ 0\ 0\ 0\ 0\ 1\ 0\ 0\ 0\ 0\ 0\ 0\ 0\ 0\ 0\ 0 \\ 0\ 0\ 0\ 0\ 0\ 0\ 1\ 0\ 0\ 0\ 0\ 0\ 0\ 0\ 0\ 0 \\ 0\ 0\ 0\ 0\ 0\ 0\ 0\ 1\ 0\ 0\ 0\ 0\ 0\ 0\ 0\ 0 \\ 0\ 0\ 0\ 0\ 0\ 0\ 0\ 0\ 1\ 0\ 0\ 0\ 0\ 0\ 0\ 0 \\ 0\ 0\ 0\ 0\ 0\ 0\ 0\ 0\ 0\ 1\ 0\ 0\ 0\ 0\ 0\ 0 \\ 0\ 0\ 0\ 0\ 0\ 0\ 0\ 0\ 0\ 0\ 1\ 0\ 0\ 0\ 0\ 0 \\ 0\ 0\ 0\ 0\ 0\ 0\ 0\ 0\ 0\ 0\ 0\ 1\ 0\ 0\ 0\ 0 \\ 0\ 0\ 0\ 0\ 0\ 0\ 0\ 0\ 0\ 0\ 0\ 0\ 1\ 0\ 0\ 0 \\ 0\ 0\ 0\ 0\ 0\ 0\ 0\ 0\ 0\ 0\ 0\ 0\ 0\ 1\ 0\ 0 \\ 0\ 0\ 0\ 0\ 0\ 0\ 0\ 0\ 0\ 0\ 0\ 0\ 0\ 0\ 1\ 0 \\ 0\ 0\ 0\ 0\ 0\ 0\ 0\ 0\ 0\ 0\ 0\ 0\ 0\ 0\ 0\ 1\end{array}\right.\end{array}\right.$$

$p$

ERROR CORRECTION CIRCUIT, MEMORY SYSTEM, AND ERROR CORRECTION METHOD

CROSS-REFERENCE TO RELATED APPLICATIONS

This application is based on and claims priority from Korean Patent Applications Nos. 10-2021-0154257 filed on Nov. 10, 2021, and 10-2022-0059102 filed on May 13, 2022, in the Korean Intellectual Property Office, the disclosures of which are incorporated by reference herein in their entireties.

BACKGROUND

1. Field

The disclosure relates to a memory device, and more particularly, to an error correction circuit and a memory system.

2. Description of Related Art

A semiconductor memory device may be a memory device realized by using a semiconductor, such as silicon (Si), germanium (Ge), gallium arsenide (GaAs), indium phosphide (InP), etc. A semiconductor memory device may be classified as a volatile memory device or a nonvolatile memory device.

A volatile memory device may be a memory device that loses stored data when a power supply is blocked, and the nonvolatile memory device may be a memory device that retains the stored data even when the power supply is blocked. A type of nonvolatile memory device, dynamic random-access memory (DRAM), has a high access rate, and thus, is widely used as an operating memory, a buffer memory, a main memory, etc. of a computing system. Recently, as computing techniques have developed, the demand for the DRAM as the operating memory of the computing system has increased.

To realize a high capacity, a plurality of DRAMs may be provided in the form of a memory module. Therefore, there is a need for a method of efficiently correcting and managing an error which may occur in the memory module.

SUMMARY

Provided is an error correction circuit for correcting errors occurring in a plurality of memory devices by using a few parity bits.

Additional aspects will be set forth in part in the description which follows and, in part, will be apparent from the description, or may be learned by practice of the presented embodiments.

In accordance with an aspect of the disclosure, an error correction circuit includes an error correction code (ECC) encoder configured to generate parity data corresponding to main data based on a parity generation matrix, and to output a codeword including the main data and the parity data to a plurality of memory devices; and an ECC decoder configured to: read the codeword from the plurality of memory devices, generate a syndrome corresponding to the codeword based on a parity check matrix, detect an error pattern based on the syndrome, generate a plurality of estimation syndromes corresponding to the error pattern using a plurality of partial sub-matrices included in the parity check matrix, and correct an error included in the read codeword based on a result of a comparison between the syndrome and the plurality of estimation syndromes.

In accordance with an aspect of the disclosure, a memory system includes a memory module comprising a plurality of memory devices configured to store a codeword including a main data set and a parity data set corresponding to the main data set; and a memory controller configured to: generate a syndrome corresponding to the codeword received from the memory module, using a parity check matrix having a value which depends on a location of an error which is a correction target, detect an error pattern based on the syndrome, generate a plurality of estimation syndromes corresponding to the error pattern using a plurality of partial sub-matrices included in the parity check matrix, and correct an error included in the codeword based on a result of a comparison between the syndrome and the plurality of estimation syndromes, during a read operation.

In accordance with an aspect of the disclosure, an error correction method includes generating a syndrome corresponding to a codeword using a parity check matrix; detecting an error pattern based on the syndrome; generating a plurality of estimation syndromes corresponding to the error pattern using a plurality of partial sub-matrices which are included in the parity check matrix and correspond to N memory devices, wherein N is a natural number greater than or equal to 2; comparing the syndrome with the plurality of estimation syndromes; selecting a target memory device from among the N memory devices based on a result of the comparison; and correcting, based on the error pattern, a portion of the codeword which is output by the target memory device.

In accordance with an aspect of the disclosure, an error correction circuit includes an error correction code (ECC) encoder configured to: generate a parity data set corresponding to a main data set based on a parity generation matrix, and generate a write codeword based on the parity data set and the main data set, and output the write codeword to a plurality of memory devices; and an ECC decoder configured to: receive a read codeword from the plurality of memory devices, wherein the read codeword corresponds to the write codeword, generate a syndrome corresponding to the read codeword based on a parity check matrix, generate a plurality of estimation syndromes using a plurality of partial sub-matrices included in the parity check matrix, perform a comparison between the syndrome and the plurality of estimation syndromes, wherein each estimation syndrome of the plurality of estimation syndromes is associated with a corresponding memory device from among the plurality of memory devices, and correct an error included in the read codeword based on a result of the comparison.

BRIEF DESCRIPTION OF DRAWINGS

The above and other aspects, features, and advantages of certain embodiments of the present disclosure will be more apparent from the following description taken in conjunction with the accompanying drawings, in which:

FIG. 7 illustrates a zero sub-matrix in FIG. 6, according to an embodiment;

FIG. 8 illustrates a unit sub-matrix in FIG. 6, according to an embodiment;

DETAILED DESCRIPTION OF EMBODIMENTS

Figure 1:
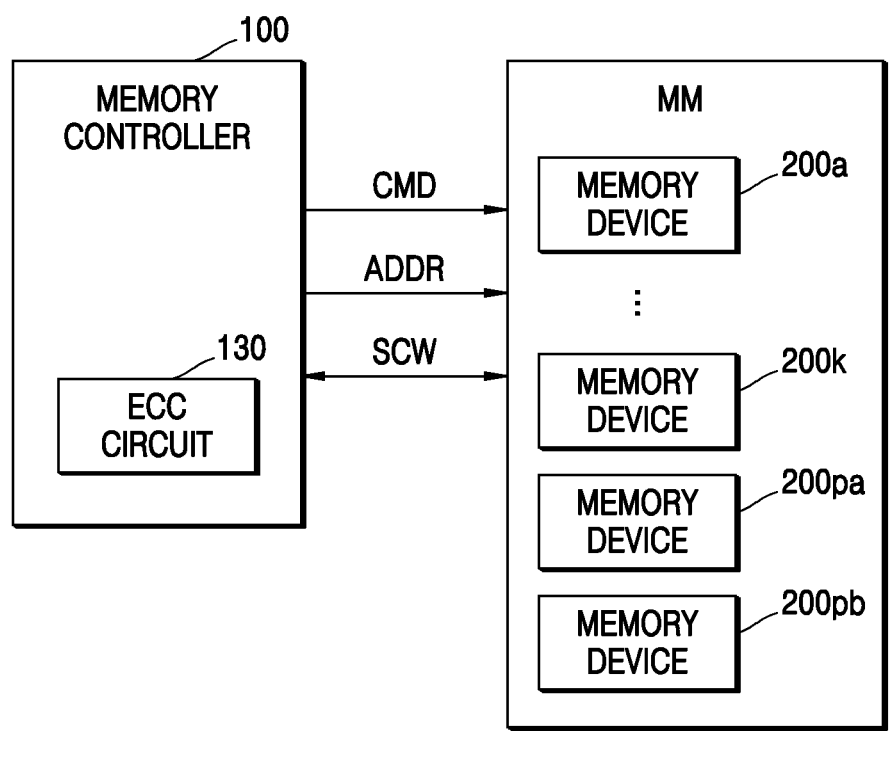
FIG. 1 is a block diagram of a memory system according to an embodiment.

Hereinafter, various embodiments are described with reference to the accompanying drawings.

As is traditional in the field, the embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. In embodiments, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the present scope. Further, the blocks, units and/or modules of the embodiments may be physically combined into more complex blocks, units and/or modules without departing from the present scope.

FIG. 1 is a block diagram of a memory system 20 according to embodiments.

Referring to FIG. 1, the memory system 20 may include a memory controller 100 and a memory module MM. The memory module MM may include a plurality of memory chips. The plurality of memory chips 200 may include a plurality of data chips 200a to 200k, a first parity chip 200pa, and a second parity chip 200pb. Each of the plurality of memory chips 200 may be referred to as a semiconductor memory device.

The memory controller 100 may generally control operation of the memory system 20 and control a general data exchange operation between an external host and memories (or the memory chips 200). For example, the memory controller 100 may control the memory chips 200 to write data or read data, in response to a request of the host.

Also, the memory controller 100 may control operations of the memory chips 200 by applying operation commands for controlling the memory chips 200. According to an embodiment, each of the memory chips 200 may be a dynamic random access memory (DRAM) including volatile memory cells.

According to an embodiment, the number of data chips 200a to 200k may be 16, but embodiments are not limited thereto. According to an embodiment, each of the data chips 200a to 200k may be referred to as a data memory, and each of the first and second parity chips 200pa and 200pb may be referred to as an error correction code (ECC) memory or a redundant memory.

The memory controller 100 may apply a command CMD and an address ADDR to the memory module MM and may exchange a codeword set SCW with the memory module MM.

The memory controller 100 may include an ECC circuit 130, and the ECC circuit 130 may generate a parity data set by performing ECC encoding on a main data set and metadata by using a parity generation matrix and may provide the codeword set SCW including the main data set, the metadata, and the parity data set to the memory module MM in a write operation. The main data set may be stored in the data chips 200a to 200k, and the metadata and a portion of the parity data set may be stored in the first parity chip 200pa, and the other portion of the parity data set may be stored in the second parity chip 200pb.

According to some embodiments, p (where p is a positive integer) bits output by each of the memory chips 200 may be referred to as a symbol. For example, p may be 16. The ECC circuit 130 may read a first symbol and a second symbol from each of the memory chips 200 and may correct an error with respect to the first symbol and the second symbol. The first symbol may denote p bits firstly output by the memory chips 200, and the second symbol may denote p bits later output by the memory chips 200. The first symbols and the second symbols output by the memory chips 200 may be included in a codeword.

The ECC circuit 130 may generate a syndrome with respect to the codeword by using the parity generation matrix. The ECC circuit 130 may identify a symbol including an error bit based on the syndrome. That is, the ECC circuit 130 may identify whether an error bit is generated in the first symbol or the second symbol. Also, the ECC circuit 130 may identify an error pattern of the symbol in which an error is generated, based on the syndrome.

However, when the number of parity data sets is less than the number of bits included in the main data set and the metadata set, it may be difficult to identify a memory chip in which an error is output, based on the syndrome. That is, the ECC circuit 130 may not identify which memory chip outputs a symbol in which an error is generated, only based on the syndrome.

The ECC circuit 130 according to an embodiment may generate estimation syndromes with respect to the error pattern by using a plurality of parity check sub-matrices included in a parity check matrix. The plurality of parity check sub-matrices may correspond to symbols output by the memory chips 200, respectively. Thus, the plurality of estimation syndromes may correspond to the memory chips 200. For example, each estimation syndrome may respectively correspond to a memory chip.

The ECC circuit 130 may compare the syndrome with the estimation syndrome and may identify a memory chip from which an error pattern is output, based on a result of the comparison. The ECC circuit 130 may correct an error of the codeword, based on the symbol and the error pattern output by the identified memory chip.

Figure 2:
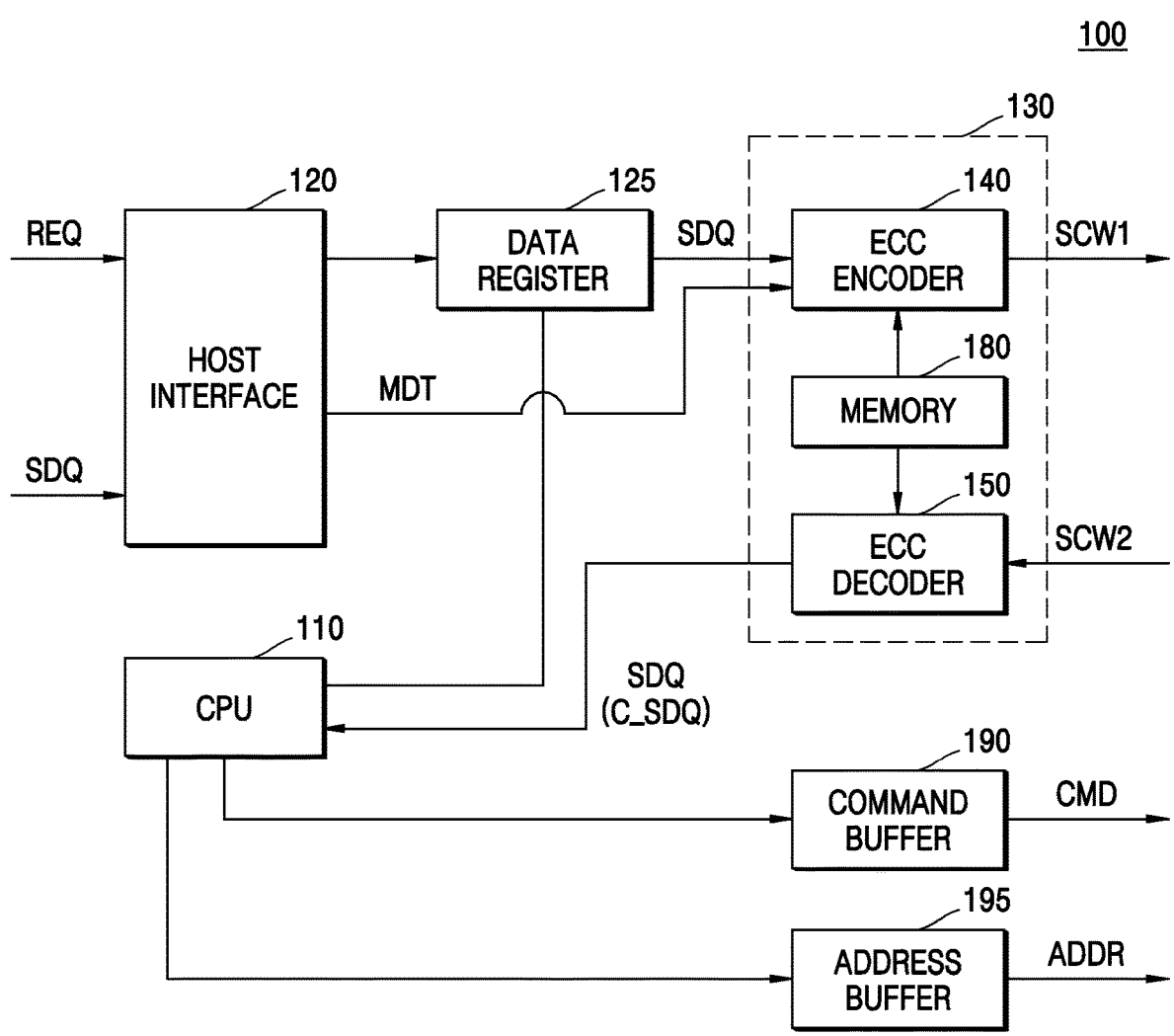
FIG. 2 is a block diagram of a memory controller in the memory system of FIG. 1, according to an embodiment.

FIG. 2 is a block diagram of the memory controller 100 in the memory system 20 of FIG. 1, according to embodiments.

Referring to FIG. 2, the memory controller 100 may include a central processing unit (CPU) 110, a host interface 120, a data register 125, the ECC circuit 130, a command buffer 190, and an address buffer 195. The ECC circuit 130 may include an ECC encoder 140, an ECC decoder 150, and a memory 180.

The host interface 120 may receive a request REQ and main data SDQ provided from an external host, generate metadata MDT related to the main data SDQ, provide the main data SDQ to the data register 125, and provide the metadata MDT to the ECC encoder 140. The data register 125 may provide the main data SDQ to the ECC circuit 130.

The ECC encoder 140 may output a codeword set SCW1 by performing ECC encoding on the main data SDQ and the metadata MDT by using a parity generation matrix.

The ECC decoder 150 may output a decoding state flag to the CPU 110 by using a parity check matrix with respect to a codeword set SCW2 and may provide the main data set SDQ or corrected main data set C SDQ to the CPU 110. The ECC decoder 150 may generate a syndrome by performing ECC decoding on the codeword set SCW2 by using the parity check matrix. The ECC decoder 150 may identify an error pattern included in the codeword set SCW2, based on the syndrome.

The ECC decoder 150 may generate a plurality of estimation syndromes with respect to the error pattern by using a plurality of parity check sub-matrices included in the parity check matrix. The plurality of estimation syndromes may correspond to the plurality of memory chips, respectively.

The ECC decoder 150 may compare the syndrome with the plurality of estimation syndromes and correct a symbol received from a memory chip corresponding to an estimation syndrome that is the same as the syndrome. That is, based on the syndrome and the estimation syndromes, the ECC decoder 150 may correct a correctable error of the main data set included in the codeword set SCW2, in a symbol unit.

The memory 180 may store the parity generation matrix and the parity check matrix.

The CPU 110 may receive the main data set SDQ or the corrected main data set C SDQ and control the ECC circuit 130, the command buffer 190, and the address buffer 195. The command buffer 190 may store a command CMD corresponding to a request REQ and transmit the command CMD to the memory module MM, according to control by the CPU 110.

The address buffer 195 may store an address ADDR and transmit the address ADDR to the memory module MM according to control by the CPU 110.

Figure 3:
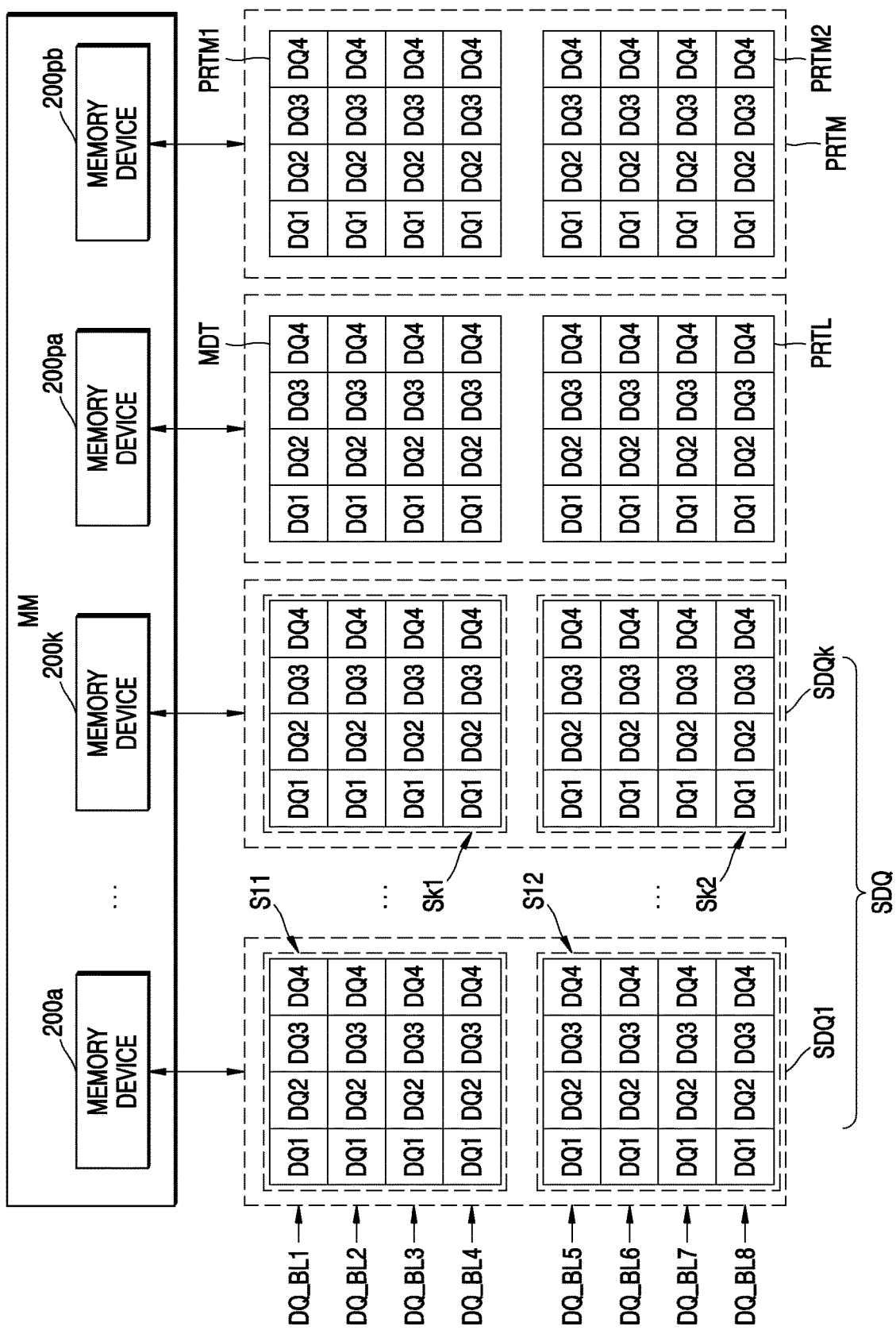
FIG. 3 illustrates data sets corresponding to a plurality of burst lengths provided to each of data chips and parity chips or output from each of the data chips and the parity chips in the memory system of FIG. 1, according to an embodiment.

FIG. 3 illustrates data sets corresponding to a plurality of burst lengths provided to each of the data chips and the parity chips or output from each of the data chips and the parity chips in the memory system 20 of FIG. 1.

Referring to FIG. 3, each of the data chips 200*a* to 200*k* and the parity chips 200*pa* and 200*pb* may perform a burst operation.

Here, the burst operation may refer to an operation, in which the data chips 200*a* to 200*k* and the parity chips 200*pa* and 200*pb* write or read a great amount of data by sequentially decreasing or increasing an address from an initial address received from the memory controller 100. A basic unit of the burst operation may be referred to as a burst length BL.

Referring to FIG. 3, data sets SDQ1 to SDQk may be input to, or output from, the data chips 200*a* to 200*k*, respectively. Each of the data sets SDQ1 to SDQk may include data bursts DQ_BL1 to DQ_BL8 corresponding to a plurality of burst lengths. The data sets SDQ1 to SDQk may correspond to the main data set SDQ. In FIG. 3, the burst length BL is assumed to be 4. That is, 4 bits received through first to fourth DQ pins DQ1 to DQ4 may be the data bursts.

Referring to FIG. 3, each of the data sets SDQ1 to SDQk may include 2 symbols. A symbol may include 4 data bursts and may include 16 bits. The symbol output from each data firstly chip may be referred to as a first symbol, and the subsequent symbol may be referred to as a second symbol. For example, the data set SDQ1 may include a first symbol S11 and a second symbol S12, and the data set SDQk may include a first symbol Sk1 and a second symbol Sk2.

While the burst operation is performed by each of the data chips 200*a* to 200*k*, metadata MDT and first parity data PRTL corresponding to a plurality of burst lengths may be input to, or output from, the first parity chip 200*pa*, and second parity data PRTM corresponding to a plurality of burst lengths may be input/output to/from the second parity chip 200*pb*. The second parity data PRTM may include first sub-parity data PRTM1 and second sub-parity data PRTM2.

The first parity data PRTL may be error locator parity data and may be related to a position of error bits included in the main data set SDQ, and the second parity data PRTM may be error size parity data and may be related to the size (or for example the number) of the error bits included in the main data set SDQ.

Figure 4:
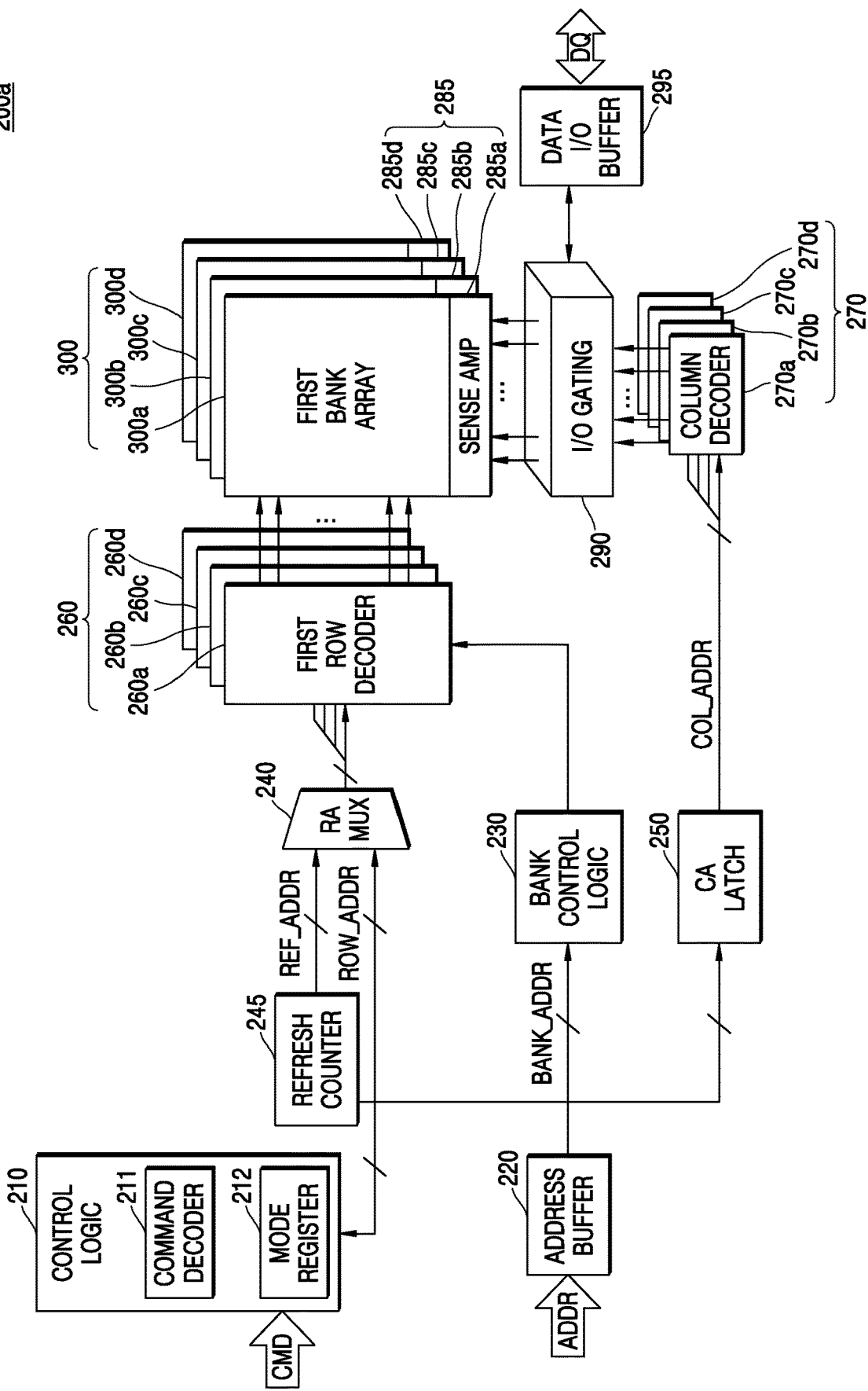
FIG. 4 is a block diagram of components of one of data chips in FIG. 1, according to an embodiment.

FIG. 4 is a block diagram of a component of one of the data chips 200*a* of FIG. 1. In embodiments, the block diagram of FIG. 4 may also correspond to one or more components of other memory chips 200.

Referring to FIG. 4, the data chip 200*a* may include a control logic circuit 210, an address buffer 220, a bank control logic 230, a row address multiplexer 240, a column address (CA) latch 250, a row decoder 260, a column decoder 270, a memory cell array 300, a sense amplifier 285, an input and output (I/O) gating circuit 290, a data I/O buffer 295, and a refresh counter 245.

The memory cell array 300 may include first to fourth bank arrays 300*a* to 300*d*. Also, the row decoder 260 may include first to fourth bank row decoders 260*a* to 260*d* connected to the first to fourth bank arrays 300*a* to 300*d*, respectively, the column decoder 270 may include first to fourth bank column decoders 270*a* to 270*d* connected to the first to fourth bank arrays 300*a* to 300*d*, respectively, and the sense amplifier 285 may include first to fourth bank sense amplifiers 285*a* to 285*d* connected to the first to fourth bank arrays 300*a* to 300*d*, respectively.

The first to fourth bank arrays 300a to 300d, the first to fourth bank sense amplifiers 285a to 285d, the first to fourth bank column decoders 270a to 270d, and the first to fourth bank row decoders 260a to 260d may form first to fourth banks, respectively. Each of the first to fourth bank arrays 300a to 300d may include a plurality of word lines, a plurality of bit lines, and a plurality of memory cells formed at a point at which the plurality of word lines and the plurality of bit lines cross each other.

The data chip 200a is illustrated in FIG. 4 as including four banks. However, embodiments are not limited thereto, and according to an embodiment, the data chip 200a may include an arbitrary number of banks.

The address buffer 220 may receive an address ADDR including a bank address BANK ADDR, a row address ROW_ADDR, and a column address COL_ADDR, from the memory controller 100. The address buffer 220 may provide the received bank address BANK ADDR to the bank control logic 230, provide the received row address ROW_ADDR to the row address multiplexer 240, and provide the received column address COL_ADDR to the column address latch 250.

The bank control logic 230 may generate bank control signals in response to the bank address BANK ADDR. In response to the bank control signals, a bank row decoder from among the first to fourth bank row decoders 260a to 260d, the bank row decoder corresponding to the bank address BANK ADDR, may be activated, and a bank column decoder from among the first to fourth bank column decoders 270a to 270d, the bank column decoder corresponding to the bank address BANK ADDR, may be activated.

The row address multiplexer 240 may receive the row address ROW_ADDR from the address buffer 220 and receive a refresh row address REF ADDR from the refresh counter 245. The row address multiplexer 240 may selectively output the row address ROW_ADDR or the refresh row address REF ADDR as a row address RA. The row address RA output from the row address multiplexer 240 may be applied to each of the first to fourth bank row decoders 260a to 260d.

The bank row decoder from among the first to fourth bank row decoders 260a to 260d, the bank row decoder being activated by the bank control logic 230, may decode the row address RA output from the row address multiplexer 240 and may activate a word line corresponding to the row address RA. For example, the activated bank row decoder may apply a word line driving voltage to the word line corresponding to the row address RA. The activated bank row decoder may generate the word line driving voltage by using a power voltage VDD and provide the word line driving voltage to the corresponding word line.

The column address latch 250 may receive the column address COL_ADDR from the address buffer 220 and may temporarily store the received column address COL_ADDR or a mapped column address MCA. Also, the column address latch 250 may gradually or sequentially increase the received column address COL_ADDR in a burst mode. The column address latch 250 may apply the column address COL_ADDR temporarily stored or gradually or sequentially increased to each of the first to fourth bank column decoders 270a to 270d.

The bank column decoder activated by the bank control logic 230 from among the first to fourth bank column decoders 270a to 270d may activate a sense amplifier corresponding to the bank address BANK ADDR and the column address COL_ADDR through the I/O gating circuit 290.

The I/O gating circuit 290 may include, in addition to circuits for gating input and output data, an input data mask logic, read data latches for storing data output from the first to fourth bank arrays 300a to 300d, and write drivers for writing data to the first to fourth bank arrays 300a to 300d.

Data read from a bank array from among the first to fourth bank arrays 300a to 300d may be sensed by a sense amplifier corresponding to the bank array and may be stored in the read data latches.

The data stored in the read data latches may be provided to the memory controller 100 through the data I/O buffer 295. The data set SDQ1 to be written in one bank array from among the first to fourth bank arrays 300a to 300d may be provided to the data I/O buffer 295 from the memory controller 100. The data set SDQ1 provided to the data I/O buffer 295 may be provided to the I/O gating circuit 290.

The control logic circuit 210 may control an operation of the data chip 200a. For example, the control logic circuit 210 may generate control signals for the data chip 200a to perform a write operation or a read operation. The control logic circuit 210 may include a command decoder 211 configured to decode a command CMD received from the memory controller 100 and a mode register 212 configured to configure an operation mode of the data chip 200a.

Each of the first and second parity chips 200pa and 200pb of FIG. 1 may have substantially the same configuration as the data chip 200a, for example the configuration illustrated in FIG. 4. Each of the first and second parity chips 200pa and 200pb may input and output corresponding parity data.

Figure 5:
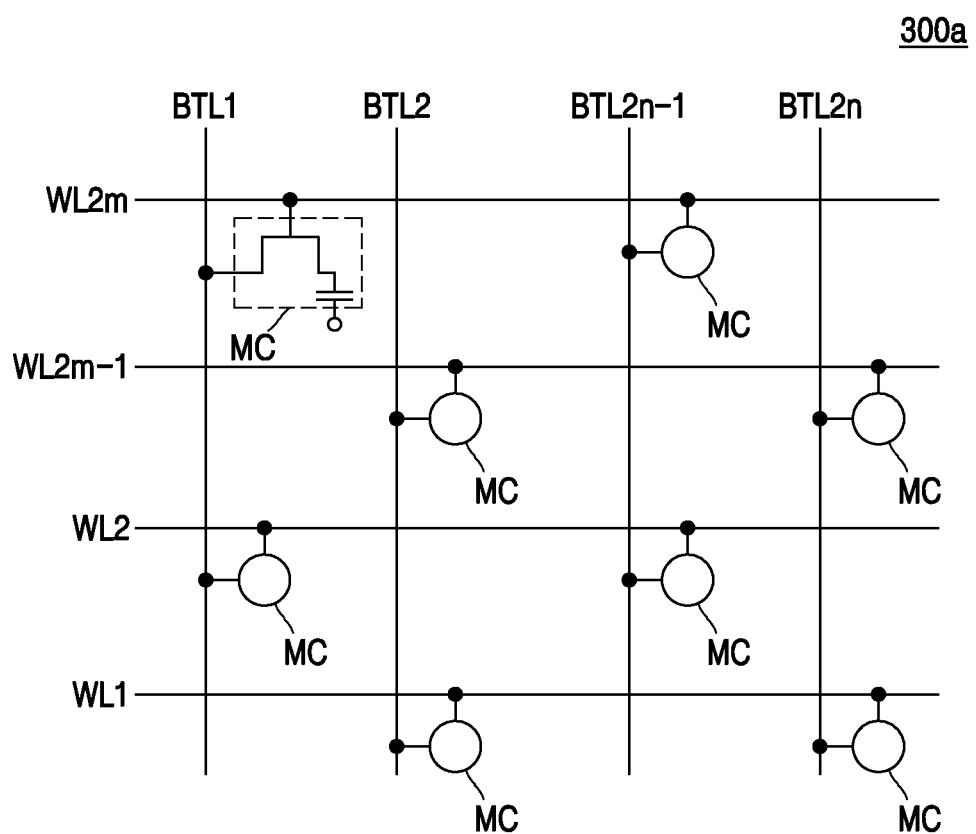
FIG. 5 illustrates a first bank array of the data chip of FIG. 4, according to an embodiment.

FIG. 5 illustrates the first bank array 300a in the data chip 200a of FIG. 4, according to embodiments.

Referring to FIG. 5, the first bank array 300a may include a plurality of word lines WL1 to WL2m (where m is an integer greater than or equal to 2), a plurality of bit lines BTL1 to BTL2n (where n is an integer greater than or equal to 2), and a plurality of memory cells MCs arranged at a crossing point between the plurality of word lines WL1 to WL2m and the plurality of bit lines BTL1 to BTL2n. Each memory cell MC may have a DRAM cell structure. The word lines WLs to which the memory cells MCs are connected may be defined as rows of the first bank array 300a, and the bit lines BLs to which the memory cells MCs are connected may be defined as columns of the first bank array 300a.

Figure 6:
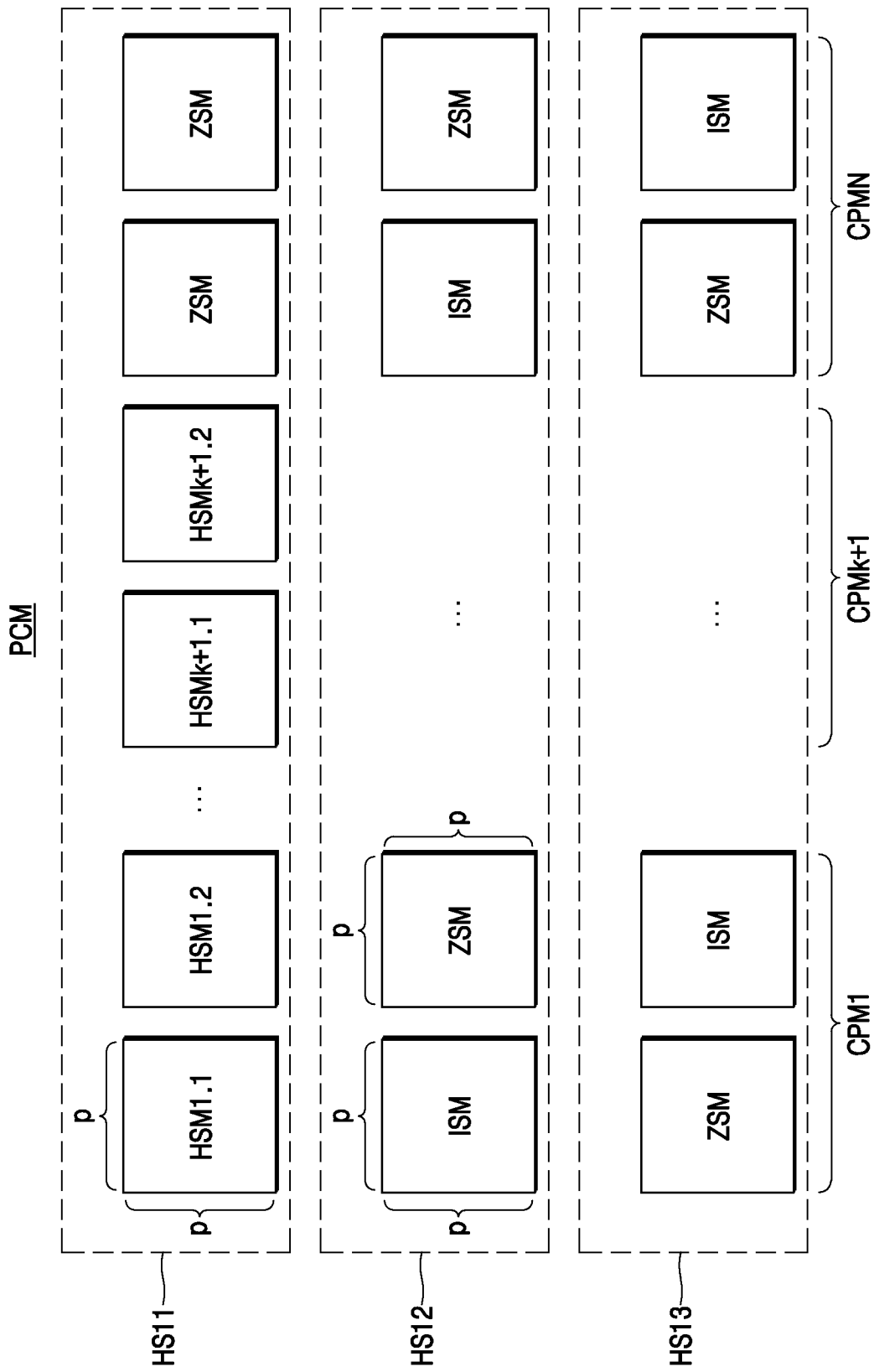
FIG. 6 illustrates a parity check matrix stored in a memory of an error correction code (ECC) circuit of FIG. 4, according to an embodiment.

FIG. 6 illustrates a parity check matrix PCM stored in a memory in an ECC circuit of FIG. 4.

Referring to FIG. 6, the parity check matrix PCM may include a first parity check sub-matrix HS11, a second parity check sub-matrix HS12, and a third parity check sub-matrix HS13.

The first parity check sub-matrix HS11 may include partial sub-matrices HSM1.1 to HSMk.2 corresponding to the data chips 200a to 200k and two zero sub-matrices ZSMs corresponding to the first and second parity chips 200pa and 200pb. Each of the partial sub-matrices HSM1.1 to HSMk.2 and each of the zero sub-matrices ZSMs may have a p×p (where p is a natural number greater than or equal to 2) structure. For example, p may be 16.

The partial sub-matrices HSM1.1 to HSMk.2 may include two partial sub-matrices calculated with symbols output from each memory chip. For example, referring to FIG. 3, when generating a syndrome, the partial sub-matrix HSM1.1 and the partial sub-matrix HSM1.2 may be respectively calculated with the first symbol S11 and the second symbol S12 output from the data chip 200a, and the partial sub-matrix HSMk.1 and the partial sub-matrix HSMk.2 may be respectively calculated with the first symbol Sk1 and the second symbol Sk2 output from the memory chip 200k.

The second parity check sub-matrix HS12 may include a unit sub-matrix ISM having a p×p structure and a zero sub-matrix ZSM having a p×p structure, the unit sub-matrix ISM and the zero sub-matrix ZSM being alternately repeated, and the third parity check sub-matrix HS13 may include a zero sub-matrix ZSM and a unit sub-matrix ISM alternately repeated.

The parity check matrix PCM may include column partial matrices CPM1 to CPMN. The column partial matrices CPM1 to CPMN may correspond to the memory chips 200, respectively. N may indicate the number of the memory chips. When generating an estimation syndrome, each of the column partial matrices CPM1 to CPMk may be calculated with an error pattern detected based on the syndrome. For example, the column partial matrix CPM1 may be calculated with the error pattern to generate the estimation syndrome, and the estimation syndrome and the syndrome may be compared with each other to determine whether or not an error is included in the data set SDQ1 of the data chip 200a.

FIG. 7 illustrates the zero sub-matrix ZSM of FIG. 6.

Referring to FIG. 7, in the zero-sub matrix ZSM, all of p×p matrix elements may be zero, which may refer to a low level or '0'.

FIG. 8 illustrates the unit sub-matrix ISM of FIG. 6

Referring to FIG. 8, in the unit sub-matrix ISM, only p matrix elements in a diagonal direction from among p×p matrix elements may be a high level '1,' and the other matrix elements may be zero.

Figure 9:
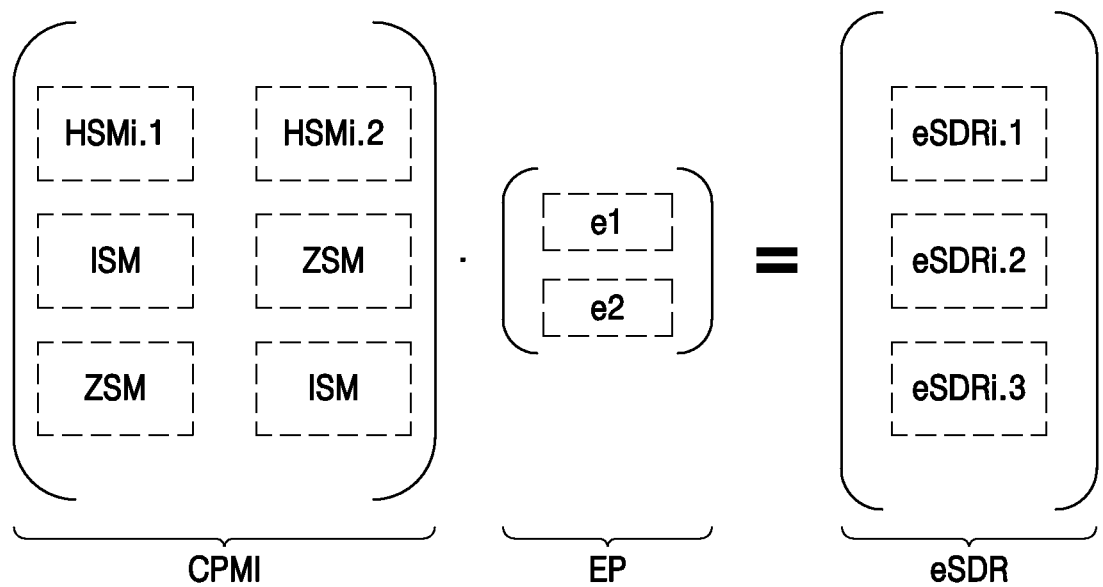
FIG. 9 is a diagram for describing a method of calculating an estimation syndrome, according to an embodiment.

FIG. 9 is a diagram for describing a method of calculating an estimation syndrome eSDR.

Referring to FIG. 9, the estimation syndrome eSDR may be calculated based on matrix multiplication between the column partial matrix CPMi and an error pattern EP. The error pattern EP may be determined by a syndrome calculated based on matrix multiplication between a parity check matrix and a codeword. The error pattern EP may include a first error e1 generated in (or based on) a first symbol and a second error e2 generated in (or based on) a second symbol.

The estimation syndrome eSDR may include a first estimation syndrome eSDRi.1, a second estimation syndrome eSDRi.2, and a third estimation syndrome eSDRi.3. Referring to FIGS. 5 and 8, the first estimation syndrome eSDRi.1 may be calculated by matrix multiplication between an overlapping portion between the first parity check sub-matrix HS11 and the column partial matrix CPMi, and the error pattern EP. In detail, the first estimation syndrome eSDRi.1 may be calculated by matrix multiplication between a partial sub-matrix HSMi.1 and the first error e1 and matrix multiplication between a partial sub-matrix HSMi.2 and the second error e2. The second estimation syndrome eSDRi.2 may be calculated by matrix multiplication between an overlapping portion between the second parity check sub-matrix HS12 and the column partial matrix CPMi, and the error pattern EP. The third estimation syndrome eSDRi.3 may be calculated by matrix multiplication between an overlapping portion between the third parity sub-matrix HS13 and the column partial matrix CPMi, and the error pattern EP.

When two arbitrary columns of the partial sub-matrix HSMi.1 are the same as each other, bits that are multiplied by the same two columns, from among bits included in the first error e1, may not be separately identified, and thus, all columns of the partial sub-matrix HSMi.1 may have to be unique. That is, a determinant of the partial sub-matrix HSMi.1 must not be 0.

Likewise, a determinant of the partial sub-matrix HSMi.2 must not be 0.

Figure 10:
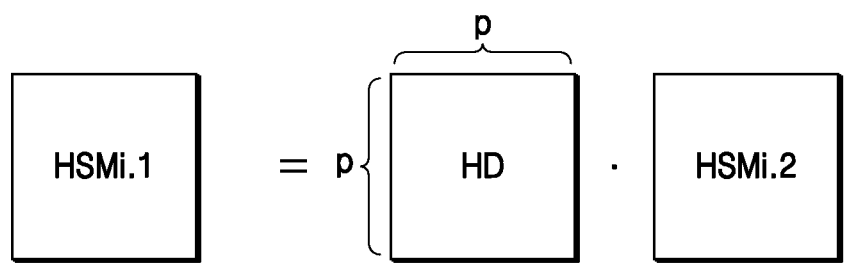
FIG. 10 is a diagram of a relationship between partial sub-matrices corresponding to one memory chip, according to an embodiment.

FIG. 10 is a diagram illustrating a relationship between the partial sub-matrices HSMi.1 and HSMi.2 corresponding to one memory chip.

Referring to FIG. 10, the partial sub-matrices HSMi.1 and HSMi.2 may correspond to a memory chip 200i. The partial sub-matrix HSMi.1 may be represented by matrix multiplication between a target sub-matrix HD and the partial sub-matrix HSMi.2. The target sub-matrix HD may have a p×p structure.

Referring to FIGS. 9 and 10, the first estimation syndrome eSDRi.1 may be calculated by Equation 1 below.

$$eSDRi.1 = HD \cdot e1 + e2) \cdot HSMi.2 \quad [\text{Equation 1}]$$

When the first estimation syndrome eSDRi.1 is 0, it is impossible to identify an error, and thus, a condition of $(HD \cdot e1 + e2) \cdot HSMi.2 \neq 0$ has to be satisfied. Thus, a condition of $HD \cdot e1 + e2 \neq 0$ has to be satisfied.

In some embodiments, when an error of the data set DQ_BL3 and the data set DQ_BL4 is a target to be detected in a first symbol, and an error of the data set DQ_BL7 and the data set DQ_BL8 is a target to be detected in a second symbol, $HD \cdot e1 + e2 \neq 0$ may be represented by Equation 2 below. A target data set in the first symbol to be detected to find the error may not be limited DQ_BL3 and BQ_BL4. A target data set in the second symbol to be detected to find the error may not be limited DQ_BL7 and BQ_BL8.

$$\begin{pmatrix} HD11 & HD12 & HD13 & HD14 \\ HD21 & HD22 & HD23 & HD24 \\ HD31 & HD32 & HD33 & HD34 \\ HD41 & HD42 & HD43 & HD44 \end{pmatrix} \begin{pmatrix} 0 \\ 0 \\ E_{BL3} \\ E_{BL4} \end{pmatrix} + \begin{pmatrix} 0 \\ 0 \\ E_{BL7} \\ E_{BL8} \end{pmatrix} \neq 0 \quad [\text{Equation 2}]$$

To develop Equation 2, it is required to satisfy Equation 3

$$\begin{pmatrix} HD13 & HD14 \\ HD23 & HD24 \end{pmatrix} \begin{pmatrix} E_{BL3} \\ E_{BL4} \end{pmatrix} \neq 0 \quad [\text{Equation 3}]$$

Thus, in order to detect the errors of the data sets DQ_BL3, DQ_BL4, DQ_BL7, and DQ_BL8, a condition that a determinant of $$\begin{pmatrix} HD13 & HD14 \\ HD23 & HD24 \end{pmatrix},$$

a sub-matrix of the target sub-matrix HD, is not 0 may be derived.

That is, a value of the target sub-matrix HD may vary according to a location of the error to be detected. Referring to FIG. 2, the memory controller 100 according to an embodiment may store the target sub-matrix HD having various values according to error locations in the memory 180.

Because the partial sub-matrices HSMi.1 and HSMi.2 are determined according to the target sub-matrix HD, the parity check matrix having various values according to error locations may be stored in the memory 180.

Figure 11:
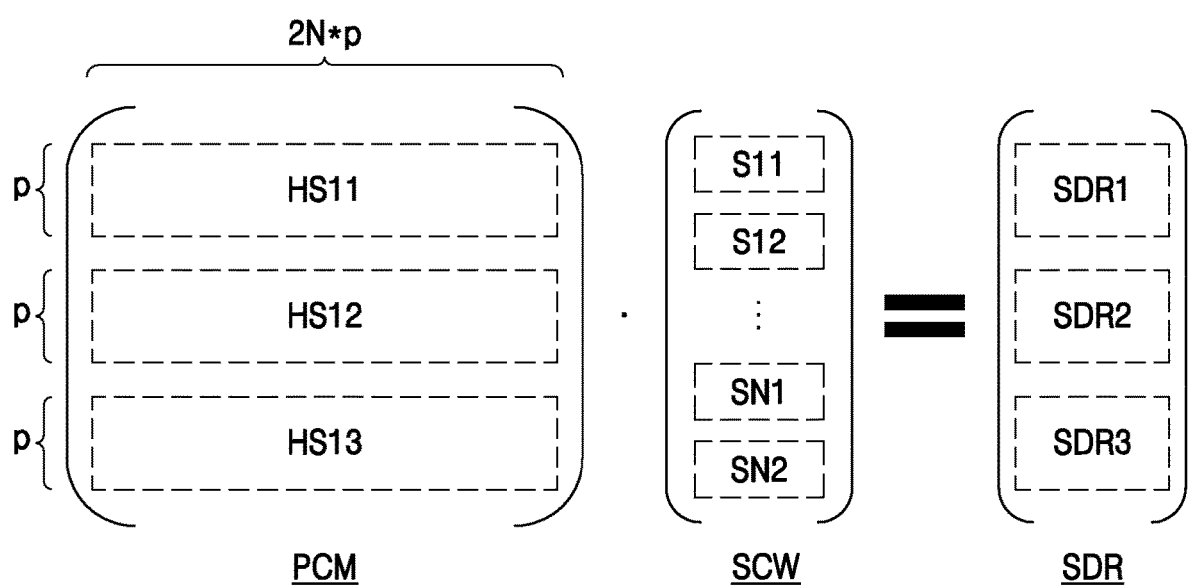
FIG. 11 is a diagram for describing a method of generating a syndrome according to an embodiment.

FIG. 11 is a diagram for describing a method of generating a syndrome SDR, according to an embodiment.

Referring to FIG. 11, the syndrome SDR may be calculated based on matrix multiplication between a parity check matrix PCM and a codeword set SCW. The syndrome SDR may include a first syndrome SDR1, a second syndrome SDR2, and a third syndrome SDR3. The parity check matrix PCM may have a p×2N*p structure, wherein N may be the number of chips, for example the number of memory chips such as memory chips 200. The codeword set SCW may include a plurality of symbols S11, S12, . . . , SN1, and SN2.

The first syndrome SDR1 may be calculated based on matrix multiplication between the first parity check sub-matrix HS11 and the codeword set SCW, the second syndrome SDR2 may be calculated based on matrix multiplication between the second parity check sub-matrix HS12 and the codeword set SCW, and the third syndrome SDR3 may be calculated based on matrix multiplication between the third parity check sub-matrix HS13 and the codeword set SCW.

Figure 12:
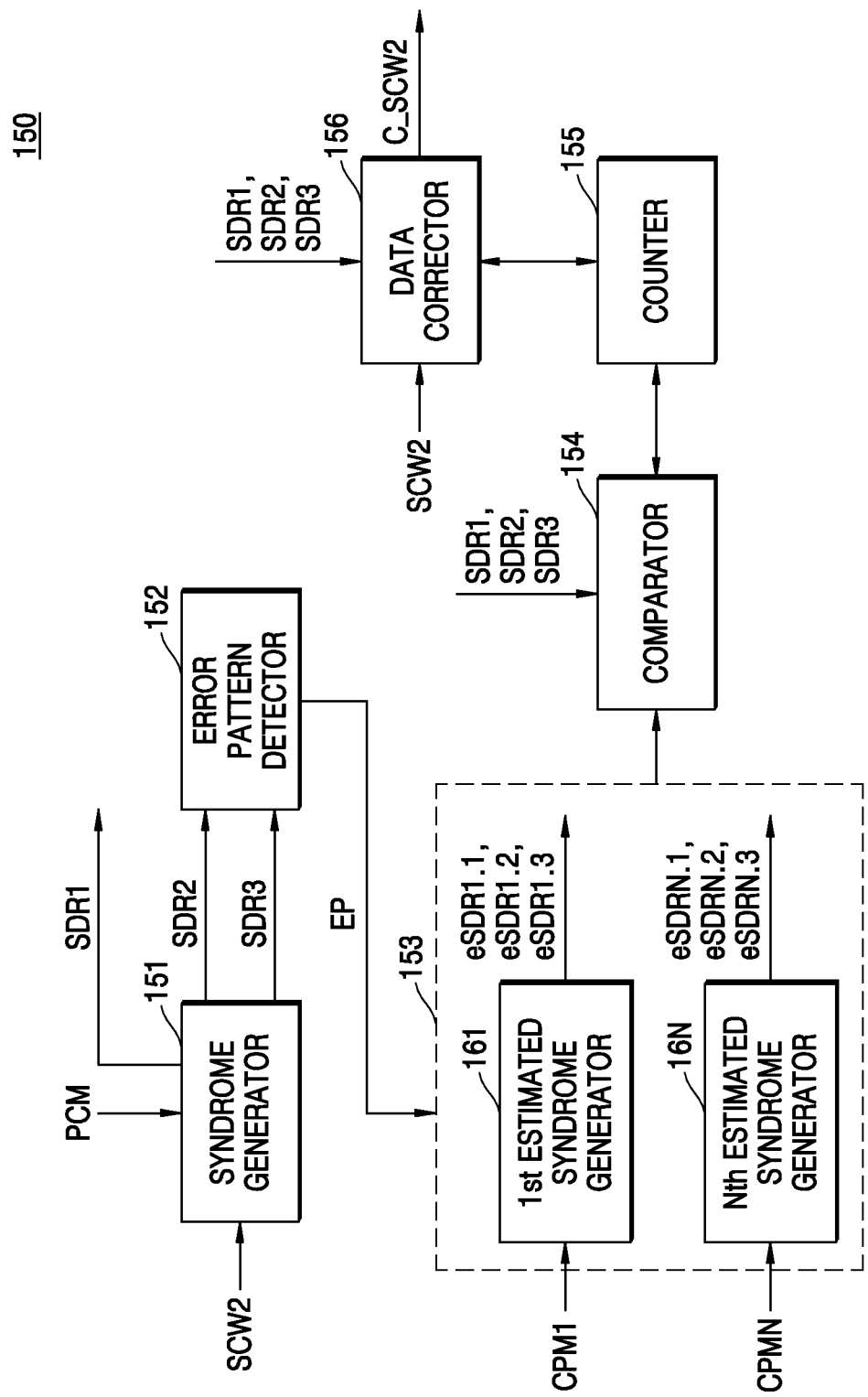
FIG. 12 is a block diagram of an ECC decoder according to an embodiment.

FIG. 12 is a block diagram of the ECC decoder 150 according to an embodiment.

Referring to FIG. 12, the ECC decoder 150 may include a syndrome generator 151, an error pattern detector 152, an estimation syndrome generator 153, a comparator 154, a counter 155, and a data corrector 156.

The syndrome generator 151 may generate the first to third syndromes SDR1 to SDR3 with respect to the codeword set SCW2 by using the parity check matrix PCM. Referring to FIG. 10, the codeword set SCW2 may include a plurality of symbols S11, S12, . . . , SN1, and SN2.

The error pattern detector 152 may detect an error pattern EP based on the second syndrome SDR2 and the third syndrome SDR3. In detail, the error pattern of a first symbol may be detected based on the second syndrome SDR2, and the error pattern of a second symbol may be detected based on the third syndrome SDR3.

The estimation syndrome generator 153 may generate first to third estimation syndromes eSDR1 to eSDR3 with respect to the error pattern EP by using the parity check matrix CPM including first to $N^{th}$ column partial matrices CPM1 to CPMN. In detail, the estimation syndrome generator 153 may include a first estimation syndrome generator 161 to an $N^{th}$ estimation syndrome generator 16N. For example, the first estimation syndrome generator 161 may generate a first estimation syndrome eSDR1.1, a second estimation syndrome eSDR1.2, and a third estimation syndrome eSDR1.3 based on matrix multiplication between the first column partial matrix CPM1 and the error pattern EP. Likewise, the $N^{th}$ estimation syndrome generator 16N may generate a first estimation syndrome eSDRN.1, a second estimation syndrome eSDRN.2, and a third estimation syndrome eSDRN.3 based on matrix multiplication between the $N^{th}$ column partial matrix CPMN and the error pattern EP.

The comparator 154 may compare the first to third syndromes SDR1 to SDR3 with first to third estimation syndromes eSDRi.1 to eSDRi.3 (i is a natural number greater than or equal to 1 and less than or equal to N). In detail, the comparator 154 may sequentially compare the estimation syndromes received from the first to $N^{th}$ estimation syndrome generators 161 to 16N with the syndromes.

When the first to third syndromes SDR1 to SDR3 and the first to third estimation syndromes eSDRi.1 to eSDRi.3 are respectively the same, the counter 155 may increase a count value. For example, when the first to third syndromes SDR1 to SDR3 are only the same as the first to third estimation syndromes eSDR1.1 to eSDR1.3 generated by the first estimation syndrome generator 161, the count value may be 1.

The data corrector 156 may identify whether or not it is possible to correct an error, based on the count value. In detail, when the count value is 1, it may be identified that error correction is possible, and when the count value is greater than or equal to 2, it may be identified that error correction is impossible.

Figure 13:
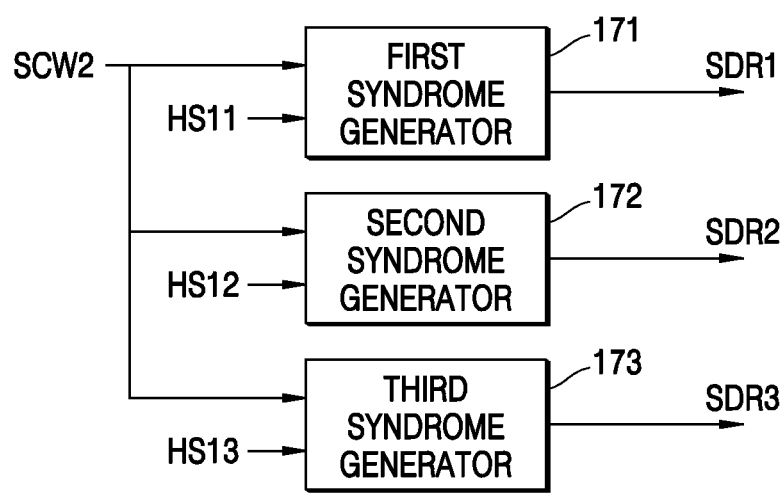
FIG. 13 is a block diagram of a syndrome generator according to an embodiment.

FIG. 13 is a block diagram of the syndrome generator 151 according to an embodiment.

Referring to FIG. 13, the syndrome generator 151 may include a first syndrome generator 171, a second syndrome generator 172, and a third syndrome generator 173.

The first syndrome generator 171 may generate the first syndrome SDR1 with respect to the codeword set SCW2 by using the first parity check sub-matrix HS11.

The second syndrome generator 172 may generate the second syndrome SDR2 with respect to the codeword set SCW2 by using the second parity check sub-matrix HS12.

The third syndrome generator 173 may generate the third syndrome SDR3 with respect to the codeword set SCW2 by using the third parity check sub-matrix HS13.

Figure 14:
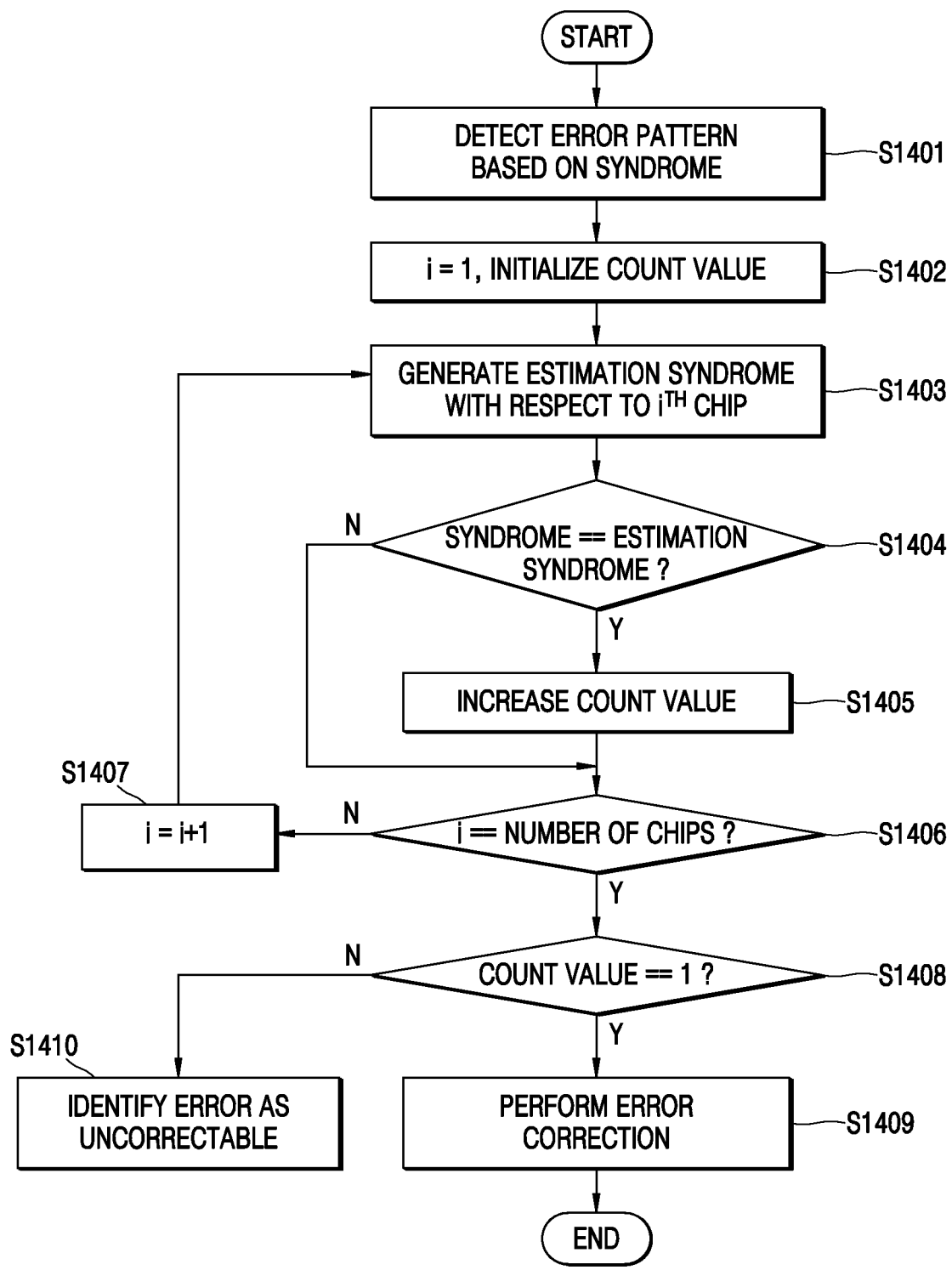
FIG. 14 is a flowchart of an ECC decoding method of an ECC circuit according to an embodiment.

FIG. 14 is a flowchart of an ECC decoding method of the ECC circuit 130 according to an embodiment. The ECC decoding method may include a plurality of operations S1401 to S1410. FIG. 14 is described below with reference to FIG. 12.

In operation S1401, the error pattern detector 152 may detect an error pattern based on a syndrome. In detail, the syndrome generator 151 may generate the syndrome with respect to the codeword set SCW2 received from the memory chip 200 by using the parity check matrix, and the error pattern detector 152 may detect the error pattern based on the generated syndrome.

In operation S1402, the data corrector 156 may initialize a count value and initialize an index i to 1. The index i may indicate an index of a memory chip.

In operation S1403, the estimation syndrome generator 153 may generate an estimation syndrome with respect to an $i^{th}$ chip. The estimation syndrome with respect to the $i^{th}$ chip may be generated by performing matrix multiplication between the error pattern and a $2i-1^{th}$ partial sub-matrix and a $2i^{th}$ partial sub-matrix from among a plurality of partial sub-matrices included in the parity check matrix.

In operation S1404, the comparator 154 may compare the syndrome with the estimation syndrome. When the syndrome and the estimation syndrome are the same as each other (Y at operation S1404), operation S1405 may be performed, and when the syndrome and the estimation syndrome are not the same as each other (N at operation S1404), operation S1406 may be performed.

In operation S1405, the counter 155 may increase the count value.

In operation S1406, when i is the same as the number of memory chips in the memory module MM (Y at operation S1406), operation S1408 may be performed, and when i is different from the number of memory chips in the memory module MM (N at operation S1406), i may increase by 1 in operation S1407, and an estimation syndrome with respect to a memory chip of a next order may be generated in operation S1403.

In operation S1408, the data corrector 156 may determine whether or not the count value is 1. When the count value is 1 (Y at operation S1408), the data corrector 156 may identify a memory chip with respect to which the corresponding count value is increased and may correct symbols output from the identified memory chip in operation S1409. When the count value is not 1 (N at operation S1408), the data corrector 156 may identify an error as uncorrectable in operation S1410.

Figure 15:
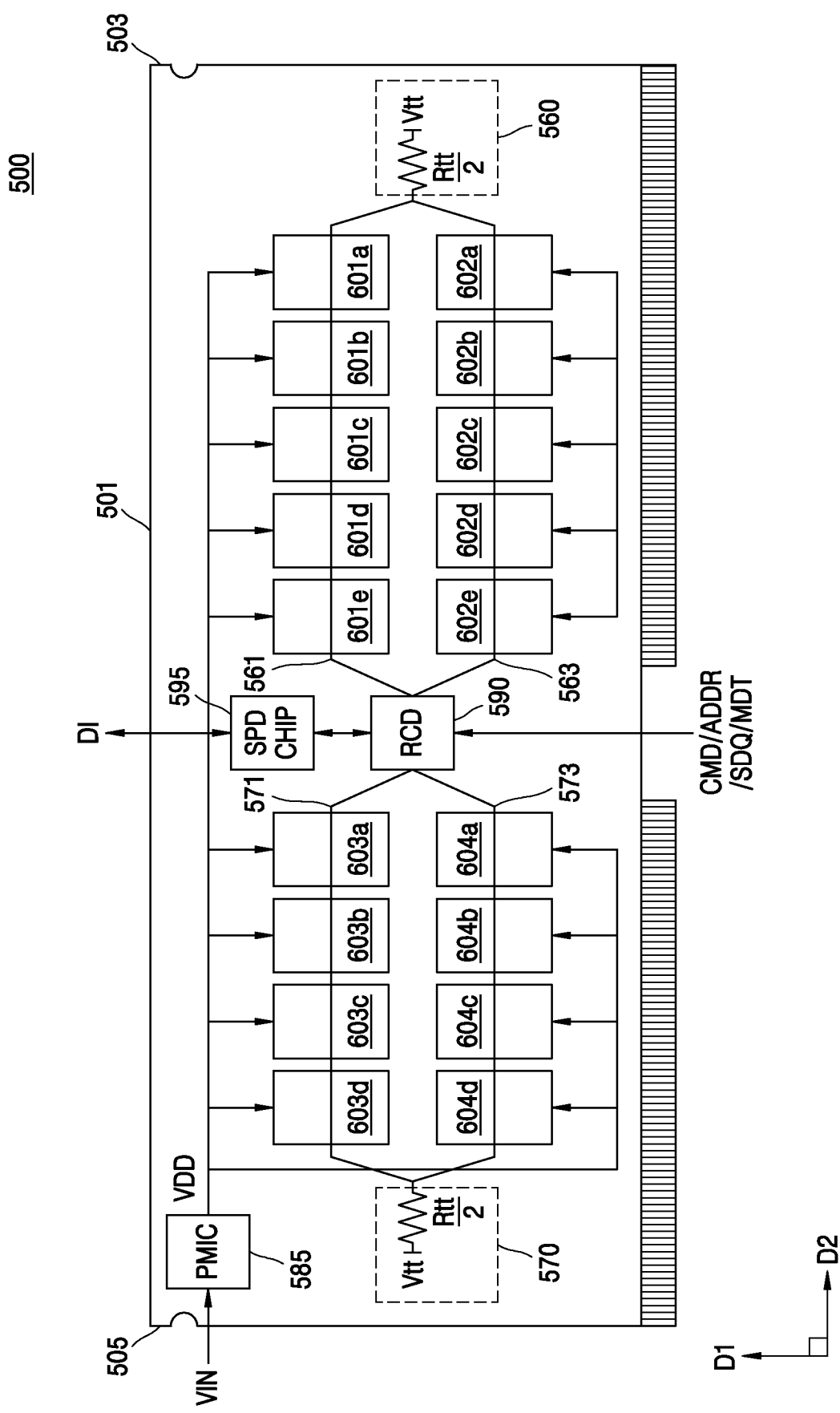
FIG. 15 is a diagram of a memory module which may be applied to a memory system according to an embodiment.

FIG. 15 is a diagram of a memory module 500, which may be applied to a memory system, according to embodiments.

Referring to FIG. 15, the memory module 500 may include a buffer chip 590, which may be for example a registering clock driver (RCD) arranged or mounted on a circuit substrate 501, a plurality of semiconductor memory devices 601a to 601e, 602a to 602e, 603a to 603d, and 604a to 604d, module resistors 560 and 570, a serial presence detection (SPD) chip 595, and a power management integrated circuit 585.

The buffer chip 590 may control the semiconductor memory devices 601a to 601e, 602a to 602e, 603a to 603d, and 604a to 604d and the power management integrated circuit (PMIC) 585 according to control by the memory controller 100. For example, the buffer chip 590 may receive an address ADDR, a command CMD, a main data set SDQ, and metadata MDT from the memory controller 100.

The SPD chip 595 may include a programmable read-only memory device, for example an electrically erasable programmable read-only memory (EEPROM). The SPD chip 595 may include initial information or device information (DI) of the memory module 500. For example, the SPD chip 595 may include the initial information or the DI of the memory module 500, such as a module form, a module configuration, a storage capacity, a module type, an execution environment, etc.

When the memory system including the memory module 500 is booted, the memory controller 100 may read the DI from the SPD chip 595 and recognize the memory module 500 based on the read DI. The memory controller 100 may control the memory module 500 based on the DI from the SPD chip 595. For example, the memory controller 100 may identify types of semiconductor devices included in the memory module 500 according to the DI from the SPD chip 595.

Here, the circuit substrate 501 is a printed circuit board and may extend in a second direction D2 vertical to a first direction D1 between a first edge portion 503 and a second edge portion 505 in the first direction D1. The buffer chip 590 may be arranged in a central portion of the circuit substrate 501, and the semiconductor memory devices 601a to 601e, 602a to 602e, 603a to 603d, and 604a to 604d may be arranged at a plurality of rows between the buffer chip 590 and the first edge portion 503 and between the buffer chip 590 and the second edge portion 505.

Here, the semiconductor memory devices 601a to 601e and 602a to 602e may be arranged at a plurality of rows between the buffer chip 590 and the first edge portion 503, and the semiconductor memory devices 603a to 603d and 604a to 604d may be arranged at a plurality of rows between the buffer chip 590 and the second edge portion 505. The semiconductor memory devices 601a to 601d, 602a to 602d, 603a to 603d, and 604a to 604d may be referred to as data chips, and the semiconductor memory devices 601e and 602e may be referred to as a first parity chip and a second parity chip.

The buffer chip 590 may generate first parity data and second parity data based on the main data set SDQ and the metadata MDT, may store the main data set SDQ and the metadata MDT in the data chips, may store first parity data in the first parity chip, and may store second parity data in the second parity chip.

The buffer chip 590 may provide a command/address signal to the semiconductor memory devices 601a to 601e through a command/address transmission line 561 and provide a command/address signal to the semiconductor memory devices 602a to 602e through a command/address transmission line 563. Also, the buffer chip 590 may provide a command/address signal to the semiconductor memory devices 603a to 603d through a command/address transmission line 571 and provide a command/address signal to the semiconductor memory devices 604a to 604d through a command/address transmission line 573.

The command/address transmission lines 561 and 563 may be commonly connected to the module resistor 560 arranged to be adjacent to the first edge portion 503, and the command/address transmission lines 571 and 573 may be commonly connected to the module resistor 570 arranged to be adjacent to the second edge portion 505. Each of the module resistors 560 and 570 may include an end resistance Rtt/2 connected to an end voltage Vtt.

Also, each of the semiconductor memory devices 601a to 601e, 602a to 602e, 603a to 603d, and 604a to 604d may be a DRAM device.

The SPD chip 595 may be arranged to be adjacent to the buffer chip 590, and the PMIC 585 may be connected between the semiconductor memory device 603d and the second edge portion 505. The PMIC 585 may generate a power voltage VDD based on an input voltage VIN and may provide the power voltage VDD to the semiconductor memory devices 601a to 601e, 602a to 602e, 603a to 603d, and 604a to 604d.

Figure 16:
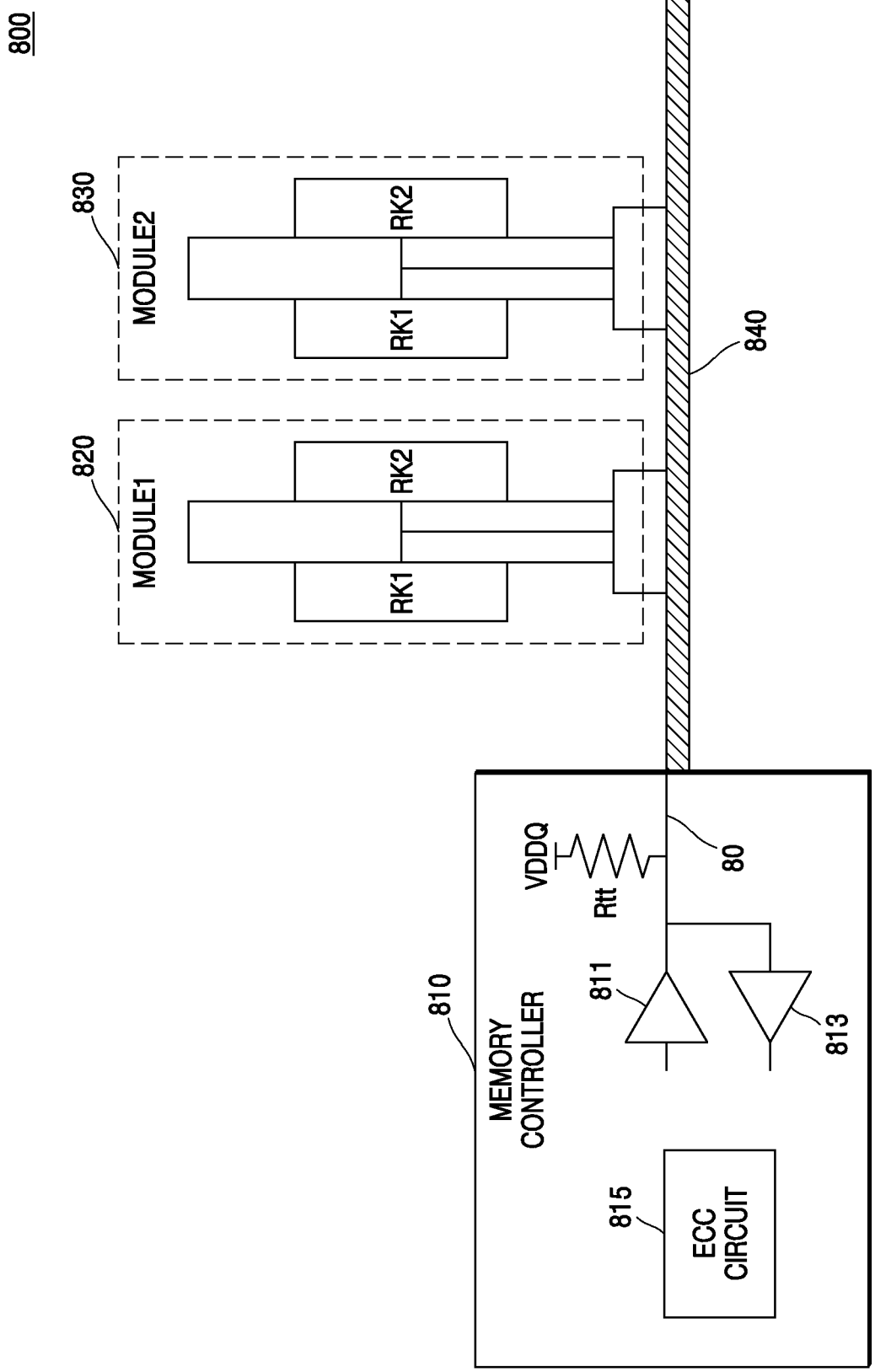
FIG. 16 is a diagram of a memory system having a quad-rank memory module according to an embodiment.

FIG. 16 is a diagram of a memory system 800 having a quad-rank memory module, according to embodiments.

Referring to FIG. 16, the memory system 800 may include a memory controller 810 and one or more memory modules, that is, a first memory module 820 and a second memory module 830.

The memory controller 810 may control the first and second memory modules 820 and 830 to execute a command applied from a processor or a host. The memory controller 810 may be realized in the processor or the host or may be realized as an application processor or a system on chip (SoC). Source termination may be realized through a resistor Rtt in a bus 80 of the memory controller 810 for signal integrity. The memory controller 810 may include an ECC circuit 815. The ECC circuit 815 may correspond to the ECC circuit 130 of FIG. 1.

Thus, the ECC circuit 815 may include an ECC encoder and an ECC decoder, and the ECC decoder may generate a syndrome by performing, by using a parity check matrix, ECC decoding on a codeword read from the one or more memory modules, that is, the first and second memory modules 820 and 830, may generate an estimation syndrome by using an error pattern detected based on the syndrome and a plurality of partial sub-matrices included in the parity check matrix, and may correct an error by comparing the syndrome with the estimation syndrome.

The first memory module 820 and the second memory module 830 may be connected to the memory controller 810 through a bus 840. Each of the first memory module 820 and the second memory module 830 may correspond to the memory module MM of FIG. 1. The first memory module 820 may include one or more memory ranks RK1 and RK2, and the second memory module 830 may include one or more memory ranks RK3 and RK4.

The first memory module 820 and the second memory module 830 may include a plurality of data chips, a first parity chip, and a second parity chip.

Figure 17:
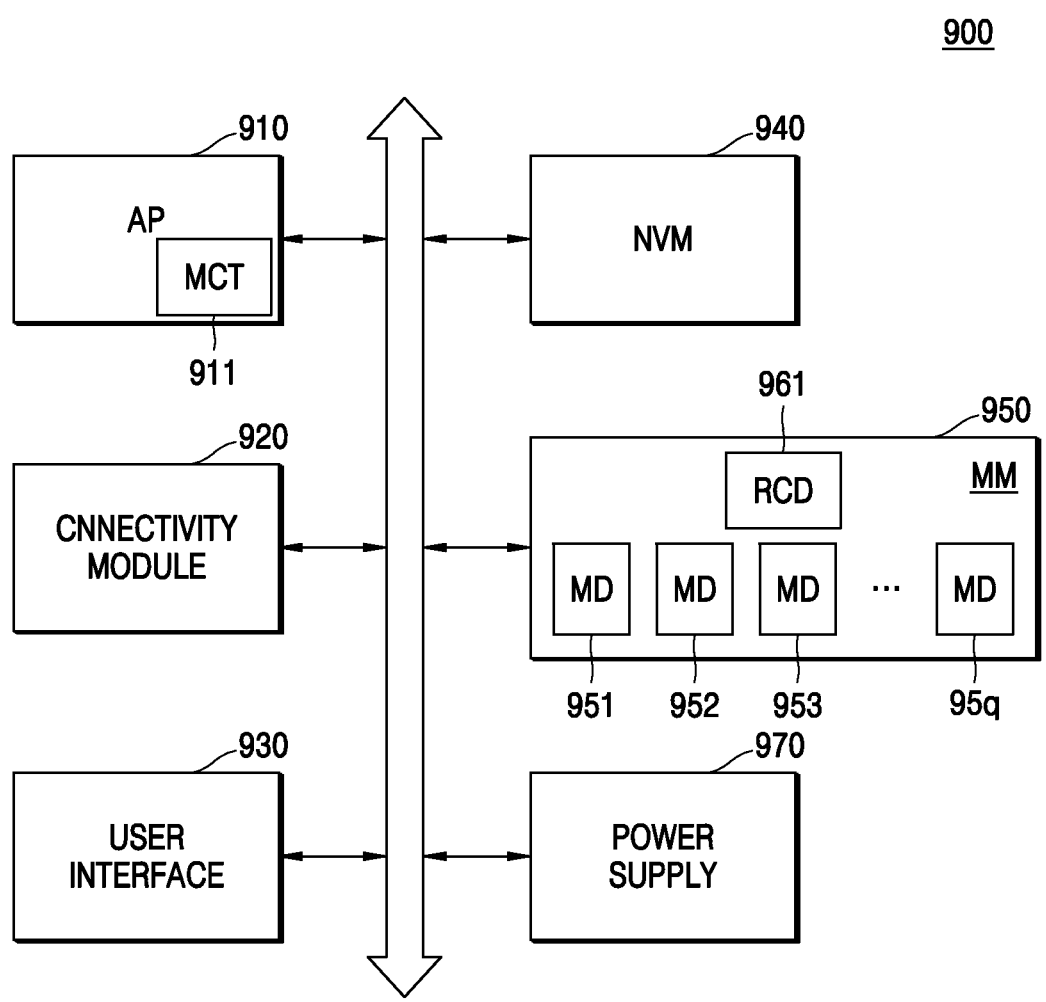
FIG. 17 is a block diagram of an example in which a memory module is applied to a mobile system 900, according to an embodiment.

FIG. 17 is a block diagram of an example in which a memory module is applied to a mobile system 900, according to an embodiment.

Referring to FIG. 17, the mobile system 900 may include an application processor (AP) 910, a connectivity module 920, a user interface 930, a nonvolatile memory (NVM) device 940, a memory module (MM) 950, and a power supply 960. The application processor 910 may include a memory controller (MCT) 911. The memory controller 911 may include the ECC circuit 130 of FIG. 1.

The application processor 910 may execute applications providing an Internet browser, a game, a video, etc. The connectivity module 920 may perform wireless communication or wired communication with an external device.

The memory module 950 may store data processed by the application processor 910 or may operate as a working memory. The memory module 950 may include a plurality of semiconductor memory devices (MD) 951 to 95q and a control device (RCD 961. In embodiments, the memory module 950 may correspond to memory module MM described above.

The plurality of semiconductor memory devices 951 to 95q may include a plurality of data chips, a first parity chip, and a second parity chip. Thus, the memory controller 911 may generate a syndrome by performing, by using a parity check matrix, ECC decoding on a codeword read from the memory module 950x, generate an estimation syndrome by using an error pattern detected based on the syndrome and a plurality of partial sub-matrices included in the parity check matrix, and correct an error by comparing the syndrome with the estimation syndrome.

The NVM device 940 may store a boot image for booting the mobile system 900. The user interface 930 may include one or more input devices, such as a keypad, a touch screen, etc., and/or one or more output devices, such as a speaker, a display, etc. The power supply 960 may supply an operating voltage of the mobile system 900.

The mobile system 900 or the components of the mobile system 900 may be mounted in various forms of packages.

As described above, embodiments are illustrated in the drawings and the specification. The embodiments herein are described by using specific terms. However, the terms are not used limit the meaning or the scope described in the claims. Therefore, it would be understood by one of ordinary skill in the art that various modifications and equivalent embodiments are possible from the described embodiments. Accordingly, the true technical scope of protection shall be defined by the following claims.

What is claimed is:

1. An error correction circuit comprising:
   an error correction code (ECC) encoder configured to generate parity data corresponding to main data based on a parity generation matrix, and to output a codeword including the main data and the parity data to a plurality of memory devices; and
   an ECC decoder configured to:
   read the codeword from the plurality of memory devices,
   generate a syndrome corresponding to the codeword based on a parity check matrix,
   detect an error pattern based on the syndrome,
   generate a plurality of estimation syndromes corresponding to the error pattern by multiplying a plurality of partial sub-matrices included in the parity check matrix with the error pattern,
   identify a memory device which output an error among the plurality of memory devices based on a result of a comparison between the syndrome and the plurality of estimation syndromes, and
   correct the error included in a symbol received from the identified memory device among a plurality of symbols included in the read codeword.

2. The error correction circuit of claim 1, wherein the codeword comprises a first symbol and a second symbol output from each of the plurality of memory devices,
   wherein a first partial sub-matrix from among the plurality of partial sub-matrices is calculated by multiplication between a second partial sub-matrix from among the plurality of partial sub-matrices and a target sub-matrix, and
   wherein the first partial sub-matrix is calculated based on the first symbol and the second partial sub-matrix is calculated based on the second symbol.

3. The error correction circuit of claim 2, wherein the target sub-matrix is determined according to a data burst from among data bursts included in the first symbol and the second symbol, and
   wherein the data burst includes at least one bit which is an error correction target.

4. The error correction circuit of claim 3, wherein a result of matrix addition between an error included in the second symbol and a result of matrix multiplication between the target sub-matrix and an error included in the first symbol is not equal to 0.

5. The error correction circuit of claim 2, wherein determinants of the first partial sub-matrix and the second partial sub-matrix are not equal to 0.

6. The error correction circuit of claim 5, wherein based on determining that a number of the plurality of estimation syndromes which are equal to the syndrome is greater than a reference number, the ECC decoder is further configured to determine that error correction is impossible.

7. The error correction circuit of claim 1, wherein based on the syndrome being equal to an estimation syndrome from among the plurality of estimation syndromes, the ECC decoder is further configured to correct the error included in a symbol received from the identified memory device corresponding to the estimation syndrome.

8. The error correction circuit of claim 1, wherein the ECC decoder comprises:
   a syndrome generation circuit configured to generate a first syndrome, a second syndrome, and a third syndrome based on the parity check matrix and the codeword;
   an estimation syndrome generation circuit configured to generate a first estimation syndrome, a second estimation syndrome, and a third estimation syndrome based on a plurality of column partial matrices, the second syndrome, and an error pattern detected based on the second syndrome, wherein the plurality of column partial matrices are included in the parity check matrix and correspond to the plurality of memory devices;
   a comparator configured to perform the comparison by comparing the first syndrome with the first estimation syndrome, the second syndrome with the second estimation syndrome, and the third syndrome with the third estimation syndrome; and
   an error corrector configured to correct the error included in a symbol received from the identified memory device from among the plurality of memory devices.

9. The error correction circuit of claim 8, wherein the syndrome generation circuit comprises:
a first syndrome generation circuit configured to generate the first syndrome based on a first parity check sub-matrix of the parity check matrix and the codeword;
a second syndrome generation circuit configured to generate the second syndrome based on a second parity check sub-matrix of the parity check matrix and the codeword; and
a third syndrome generation circuit configured to generate the third syndrome based on a third parity check sub-matrix of the parity check matrix and the codeword.

10. The error correction circuit of claim 9, wherein the plurality of partial sub-matrices are included in the first parity check sub-matrix, and
wherein the estimation syndrome generation circuit comprises:
a first estimation syndrome generation circuit configured to generate the first estimation syndrome based on the error pattern and a first portion of the plurality of column partial matrices, wherein the first portion corresponds to the first parity check sub-matrix;
a second estimation syndrome generation circuit configured to generate the second estimation syndrome based on the error pattern and a second portion of the plurality of column partial matrices, wherein the second portion corresponds to the second parity check sub-matrix; and
a third estimation syndrome generation circuit configured to generate the third estimation syndrome based on the error pattern and a third portion of the plurality of column partial matrices, wherein the third portion corresponds to the third parity check sub-matrix.

11. A memory system comprising:
a memory module comprising a plurality of memory devices configured to store a codeword including a main data set and a parity data set corresponding to the main data set; and
a memory controller configured to:
generate a syndrome corresponding to the codeword received from the memory module, using a parity check matrix having a value which depends on a location of an error which is a correction target,
detect an error pattern based on the syndrome,
generate a plurality of estimation syndromes corresponding to the error pattern using by multiplying a plurality of partial sub-matrices included in the parity check matrix with the error pattern,
identify a memory device which output an error among the plurality of memory devices based on a result of a comparison between the syndrome and the plurality of estimation syndromes, and
correct the error included in a symbol received form the identified memory device among a plurality of symbols included in the codeword during a read operation.

12. The memory system of claim 11, wherein the codeword comprises a first symbol and a second symbol output from each of the plurality of memory devices,
wherein a first partial sub-matrix from among the plurality of partial sub-matrices, is calculated by multiplication between a second partial sub-matrix from among the plurality of partial sub-matrices and a target sub-matrix, and
wherein the first partial sub-matrix is calculated based on the first symbol and the second partial sub-matrix is calculated based on the second symbol.

13. The memory system of claim 12, wherein the target sub-matrix is determined according to a data burst from among data bursts included in the first symbol and the second symbol, and
wherein the data burst includes at least one bit which is the correction target.

14. The memory system of claim 13, wherein a result of matrix addition between an error included in the second symbol and a result of matrix multiplication between the target sub-matrix and an error included in the first symbol is not equal to 0.

15. The memory system of claim 12, wherein determinants of the first partial sub-matrix and the second partial sub-matrix are not equal to 0.

16. The memory system of claim 11, wherein, based on the syndrome being equal to an estimation syndrome from among the plurality of estimation syndromes, the memory controller is further configured to correct the error received from the identified memory device corresponding to the estimation syndrome.

17. An error correction method comprising:
generating a syndrome corresponding to a codeword using a parity check matrix;
detecting an error pattern based on the syndrome;
generating a plurality of estimation syndromes corresponding to the error pattern using a plurality of partial sub-matrices which are included in the parity check matrix and correspond to N memory devices, wherein N is a natural number greater than or equal to 2;
comparing the syndrome with the plurality of estimation syndromes;
selecting a target memory device from among the N memory devices based on a result of the comparison; and
correcting, based on the error pattern, a portion of the codeword which is output by the target memory device.

18. The error correction method of claim 17, wherein the generating of the syndrome comprises generating a first syndrome, a second syndrome, and a third syndrome by performing matrix multiplication between a first symbol and a second symbol output by each of the N memory devices and the parity check matrix.

19. The error correction method of claim 18, wherein the generating of the plurality of estimation syndromes comprises generating a first estimation syndrome, a second estimation syndrome, and a third estimation syndrome by performing matrix multiplication between the error pattern and a portion of the parity check matrix, on which matrix multiplication is performed by the first symbol and the second symbol output by an $i^{th}$ memory device,
wherein i is a natural number greater than or equal to 1, and less than or equal to N.

20. The error correction method of claim 19, wherein based on the first estimation syndrome being equal to the first syndrome, the second estimation syndrome being equal to the second syndrome, and the third estimation syndrome being equal to the third syndrome, the selecting of the target memory device comprises selecting a kth memory device corresponding to the first estimation syndrome, the second estimation syndrome, and the third estimation syndrome,
wherein k is a natural number greater than or equal to 1 and less than or equal to N.

* * * * *